United States Patent
Lehner et al.

(10) Patent No.: US 7,441,213 B2
(45) Date of Patent: Oct. 21, 2008

(54) METHOD FOR TESTING THE VALIDITY OF INITIAL-CONDITION STATEMENTS IN CIRCUIT SIMULATION, AND CORRECTING INCONSISTENCIES THEREOF

(75) Inventors: Timothy S. Lehner, Hopewell Junction, NY (US); Richard D. Kimmel, Wappingers Falls, NY (US); Ali Sadigh, Irvine, CA (US); Emrah Acar, Montvale, NJ (US); Ying Liu, Austin, TX (US); Ivan L. Wemple, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 173 days.

(21) Appl. No.: 11/307,894

(22) Filed: Feb. 27, 2006

(65) Prior Publication Data

US 2007/0204244 A1 Aug. 30, 2007

(51) Int. Cl.
*G06F 17/50* (2006.01)
(52) U.S. Cl. .............................. 716/5; 703/16
(58) Field of Classification Search ............ 716/5; 703/16
See application file for complete search history.

(56) References Cited

U.S. PATENT DOCUMENTS

| | | | | |
|---|---|---|---|---|
| 4,918,643 A | * | 4/1990 | Wong | 703/4 |
| 5,313,398 A | * | 5/1994 | Rohrer et al. | 703/14 |
| 6,348,834 B1 | * | 2/2002 | Brown | 327/543 |
| 7,013,252 B1 | * | 3/2006 | Shih et al. | 703/14 |
| 7,073,146 B2 | * | 7/2006 | Sarwary et al. | 716/6 |
| 7,219,047 B2 | * | 5/2007 | Cohen et al. | 703/17 |
| 2002/0120906 A1 | * | 8/2002 | Xia et al. | 716/2 |
| 2006/0129958 A1 | | 6/2006 | Raymond et al. | 716/5 |
| 2006/0248518 A1 | * | 11/2006 | Kundert | 717/140 |

\* cited by examiner

*Primary Examiner*—Paul Dinh
*Assistant Examiner*—Patrick Sandoval
(74) *Attorney, Agent, or Firm*—H. Daniel Schnurmann

(57) ABSTRACT

A method and a system for validating initial conditions (ICs) generally provided by a user when simulating a VLSI circuit are described. Inconsistent ICs sets are detected and replaced by consistent subsets thereof. The method selects the resistance and source values in a Norton or Thevenin circuit used to enforce the IC, and detects when specified ICs are inconsistent while preserving critical or fragile ICs when a two DC-pass approach is used. It further correlates the set of consistent ICs thus obtained with an equivalent circuit and simultaneously provides an input for future use. This allows a user to be notified and given a measure of how bad the inconsistencies are. Detecting inconsistencies is achieved either by measuring the holding current or by measuring the voltage drift if the two DC-pass approach is used.

12 Claims, 3 Drawing Sheets

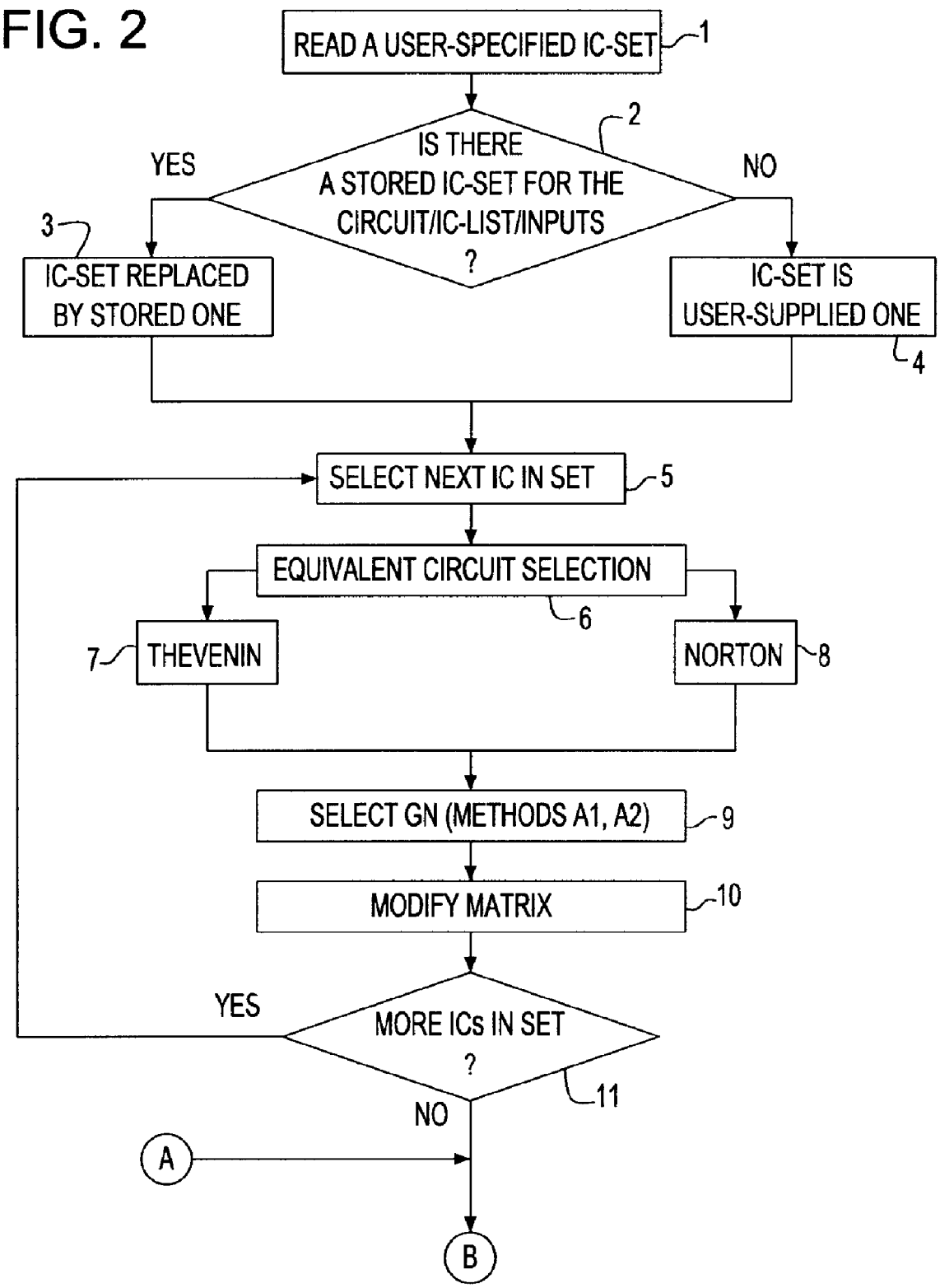

METHOD FOR TESTING THE VALIDITY OF INITIAL-CONDITION STATEMENTS IN CIRCUIT SIMULATION, AND CORRECTING INCONSISTENCIES THEREOF

BACKGROUND OF THE INVENTION

This invention relates to the field of electronic design automation of Very Large Integrated Circuits (VLSI) and more particularly, to a method and a system for validating initial conditions and correcting inconsistencies thereof, the initial conditions being used in the simulation of circuits.

Most if not all prior art circuit simulators allow a user to specify initial conditions (IC), usually in the form of a voltage at a specified node. The initial conditions are enforced during the DC portion of the simulation in which a DC operation point is established. In many applications, the user has no real way of determining ahead of time whether an IC is valid or not or whether a collection of ICs is self-consistent. Thus, the user may provide a set of ICs, of which a subset of which may be either unreasonable or collectively inconsistent. It is common for circuit simulators to handle inconsistent ICs in such a way as to allow a successful simulation despite the inconsistencies, but sometimes at the expense of result accuracy. For many applications, it would be useful if the simulator could detect inconsistent ICs and take corrective or informative action to allow the user to remove the inconsistencies. It is desirable, at the very least, to notify the user and optionally take some corrective action or, alternatively, to have the simulator do so automatically without user intervention.

In order to achieve a better understanding of the existing problem, and gain an appreciation of the basic methods used to set ICs, an overview of how node-voltage ICs are usually applied will be shown hereinafter.

Referring to FIGS. 1A and 1B, there is shown in the former a Norton equivalent circuit used to hold a node N at a voltage Vn. Practitioners of the art will readily appreciate that the actual sources may be replaced on a loop basis by an equivalent set of voltage sources in the links or loops of the network, and on a node basis, by an equivalent set of current sources bridging branches or node pairs of the network illustrated in FIG. 1B. Which set of sources is used depends on whether the loop or node-voltage methods are selected. The term 'equivalent' implies that one will obtain the same voltages and/or currents throughout the network as those resulting from the original sources present (which may be a mixture of voltages and current sources). If one were interested in computing the correct values of voltages and currents solely in a restricted portion of the network, it would be possible to replace the original sources of excitation by a single 'equivalent voltage source' or by a single 'equivalent current source' acting at an appropriate point. The two specialized processes, which are respectively pertinent to the loop and node perspectives, are known in the art as Thevenin's and Norton's equivalent circuits, and are schematically represented in the aforementioned figures. Thus, when the user specifies an IC voltage at node N, hereinafter referred to as Vic, there exists two ways in which it is commonly used by a simulator, namely by the effective application of the aforementioned Thevenin or Norton equivalent circuits.

In the first approach, using a Norton equivalent circuit, one alters the internal mathematical representation of the circuit to be simulated in a manner equivalent to adding the circuit elements of the Norton circuit of FIG. 1A. In the second approach, using a Thevenin circuit, shown in FIG. 1B, one modifies the internal mathematical representation of the user-specified circuit by effectively adding the elements of the Thevenin circuit of FIG. 1B, which determines the current Iic at node N. The Thevenin resistance R is often assumed to be 0 thus forcing the voltage Vn at the node that is to be initialized, to equal Vic. Setting the Thevenin resistance to 0 is done for efficiency purposes to eliminate introducing a new node in the circuit, thereby modifying the topology of the matrix. Since the Norton model does not suffer from this liability, it is sometimes deemed preferable over the Thevenin model. Although both approaches have their own advantages and drawbacks, both can achieve the same goal when properly implemented.

It should be recognized that the circuits used to effectively apply ICs are not limited to the simple ones depicted in FIGS. 1A and 1B. Any circuit having the same effect of forcing the node of interest N to the desired voltage Vic could be used for that purpose.

In the following discussions, except where otherwise noted, 'simulation' refers to the 'DC portion of the simulation.

SUMMARY AND OBJECTS OF THE INVENTION

Accordingly, it is an object of the present invention to provide correct initial conditions required for circuit simulation.

It is another object of the invention to detect inconsistent solutions and automatically replace them with corrected ones.

It is still another object to provide a method and a system for measuring the current needed to hold the ICs and to compare it to predetermined thresholds.

The node-set method for setting the ICs enables the circuit to relax to a consistent state while keeping a select subset of ICs while removing all others, which is followed by measuring the voltage drift at the nodes whose ICs were removed. Thus, by either measuring the holding the current or by measuring the voltage drift, a user is notified and given a measure of how bad the inconsistencies are.

The inventive method and system select the resistance of a Norton and/or Thevenin-equivalent circuit and detect when specified ICs are inconsistent. This is achieved while preserving critical or fragile ICs, and correlating the collection of consistent ICs thus obtained with a circuit and its inputs for future use.

Although other simulators have found other ways to deal with inconsistent solutions that enables them to obtain a solution despite the inconsistencies, they provide no mechanism for identifying sub-groups of inconsistent ICs and a technique for removing the worst offenders.

The present invention solves the difficulties of determining what resistance to use when applying the Norton or Thevenin equivalent circuits. The resistance (R) and the voltage (V) together with the effective input impedance of the circuit at node N determine the IC voltage (Vn) thus obtained. The value of this resistance also affects the accuracy of other embodiments of the present invention. Prior art circuit simulators need not concern themselves with this step beyond making R small enough (or G large enough) to ensure that the IC voltage Vn realized is sufficiently close to the target voltage Vic. In prior art implementations that use a Thevenin-equivalent circuit in which R=0, the selection of R is not an issue, but by directly attaching a voltage source to IC nodes it may prevent numerical convergence of the circuit and, thus, the R=0 Thevenin method is not always a preferred method for enforcing ICs. Selecting a value for R will be described hereinafter in the method referenced as "Method A".

A second group of problems solved by the inventive method is one where it is often difficult or impossible for the user to know: (a) when the ICs specified to the simulator form a consistent set; (b) which ones are inconsistent; (c) in which order ICs are to be removed in an attempt to construct a consistent set; and (d) how to preserve a subset of ICs that are critical and whose presence is essential albeit 'fragile', i.e., easily lost during simulation. The problem of being unable to accurately and consistently specify ICs can arise in at least two scenarios, mentioned herein for illustrative purposes: firstly, a user may specify an initial condition of Vic on some node when an IC consistent with other inputs is in fact a very small voltage away from Vic. Such a small voltage difference may seem insignificant to a circuit designer but it can, in fact, cause the simulation to fail to converge under certain circumstances. The second instance is where it may be difficult to even grossly predict what the IC at a node should be, if the circuit is complicated or large, when the circuit designer may simply be mistaken as to what constitutes a consistent set of initial conditions. In all cases, it is important that the simulator produce the result "intended" by the user, even if it does not solve the problem, including ICs, exactly as specified by the user. This collection of problems is addressed in methods referenced as "Method B" and "Method C".

The third problem solved by the inventive method revolves around the process of arriving at a convergent DC state when the first part of the simulation is computationally very expensive. This is even truer when methods of the present invention are used, and several simulations, each using a different set of ICs, is undertaken in order to find a consistent set. It is desirable to not have to repeat this effort if the same circuit and nominal set of ICs are to be resimulated at a later time.

Finally, the invention provides a method and a system for validating initial conditions (ICs) when simulating a circuit and correcting inconsistencies thereof, that includes the steps of: a) selecting a set of user-provided ICs and applying the ICs to respective nodes of the circuit; b) detecting inconsistencies in the user-specified IC set; c) eliminating the inconsistent ICs from the IC set and replacing the original set of user specified ICs by a sub-set thereof comprising self-consistent ICs; and d) repeating steps b) and c) until a predetermined ending criterion is met.

BRIEF DESCRIPTION OF THE DRAWINGS

The accompanying drawings, which are incorporated in and which constitute part of the specification, illustrate the presently preferred embodiments of the invention which, together with the general description given above and the detailed description of the preferred embodiments given below serve to explain the principles of the invention.

DETAILED DESCRIPTION

Figure 1A:
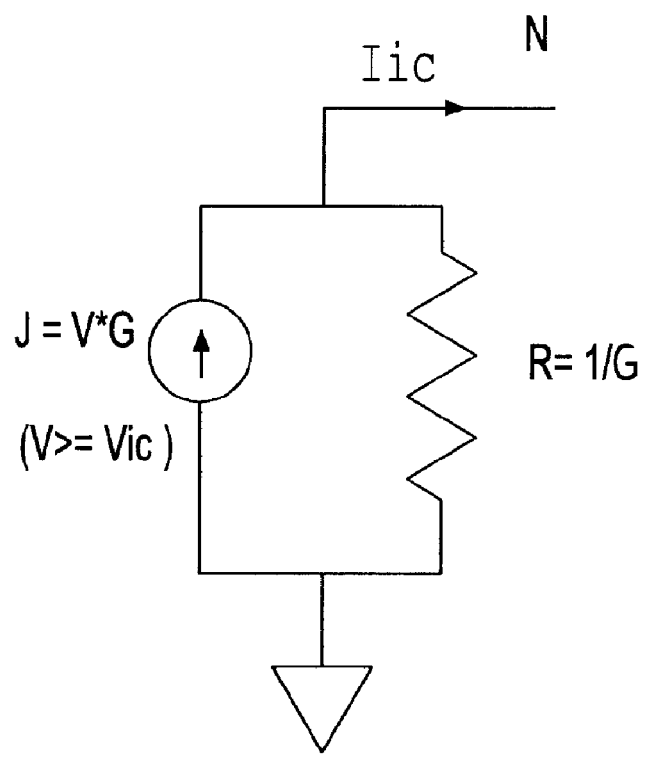
FIGS. 1A and 1B are respectively schematic diagrams of prior art Norton and Thevenin equivalent circuits.

Hereinafter are described various methods that respectively solve different aspects of the problems described above.

Method A selects the resistance in the Norton and Thevenin-equivalent approaches mentioned above.

Method B detects when specified ICs are inconsistent.

Method C handles IC inconsistencies by ensuring the preservation of critical or fragile ICs while allowing the circuit to relax into a self-consistent state.

Method D associates the plurality of consistent ICs collected and correlates them with a circuit, its inputs and user-specified ICs for future use.

A. Setting of the Resistance of the Norton or Thevenin Equivalent Circuits

The most difficult implementation issue encountered when using either a Norton or an R≠0 Thevenin equivalent circuit in the process of applying ICs is how to determine the appropriate value of the conductance (or equivalently resistance) of the resistor. One approach is to simply set the conductance very high, which may not be desirable since it may introduce numerical round-off errors.

The most advantageous approach for measuring current Iic, which will be of particular interest in method B, is to measure the difference between the realized voltage (Vn) at node N and the driving voltage (V≧Vic), and applying the equation:

$$Iic = (V-Vn)G = (V-Vn)/R. \quad \text{(Eq. 1)}$$

A conductance that is too small (i.e., too high a resistance) forces the voltage obtained to deviate significantly from the target IC voltage Vic. This can be corrected by increasing the driving loop voltage V to be greater than Vic, and by more carefully selecting the value of G. Alternatively, a conductance that is too large (i.e., a resistance that is too small) may, if that measurement method is used, it makes the difference (V-Vn) too difficult to measure accurately and, thus, the value of Iic will be less accurate than desired or needed for method B. Typically, the conductance G should be much larger (e.g., 10-100×) than the effective small-signal input impedance of node N, which will be referenced hereinafter as GN.

Method A1

A first approach for measuring GN is to traverse the user-specified netlist and sum the net effective conductance of all the elements attached to node N. For linear elements, accurate values can easily be obtained, given an operating point. For non-linear elements, a static evaluation of device impedances require technological rules such as are often available in design manuals. This approach is much less accurate, but is also simpler and, thus, may sometimes be preferable.

Method A2

The second method for measuring the impedance GN of node N is to directly examine the matrix representing the linearized circuit at a particular operating point. In certain matrix representations, one could sum the matrix elements in a row associated with node N or some other subset of the matrix stamps. Generally, the effective impedance may be extracted from examination of the matrix representing the circuit and its constituent components, once the circuit has been linearized at a certain DC operating point. This method requires that the matrix be stamped prior to applying the ICs.

Having thus obtained an effective input conductance GN of node N by either method A1 or A2, one may advantageously use GN to determine a useful value for the Norton or Thevenin impedance R=1/G by setting G to a substantially larger value than GN. The ratio of the conductance GN to G is determined by how closely one wishes the achieved voltage Vn to be to the target voltage Vic while keeping the ratio sufficiently large to avoid round-off errors in the calculation of equations 1 and 2 (shown hereinafter).

V and G should be selected such that (V-Vn) remains accurately measurable, as does the ratio (1+GN/G). If the proximity of V to Vic is relatively unimportant, one can just set V=Vic, and G>>GN. A first-order correction may optionally be made to Vn with the goal of bringing Vn closer to the target voltage Vic, by setting V according to:

$$V=Vic(1+GN/G). \quad\quad\quad\quad (Eq.\ 2)$$

B. Detection of Bad ICs

Method B1

Figure 1B:
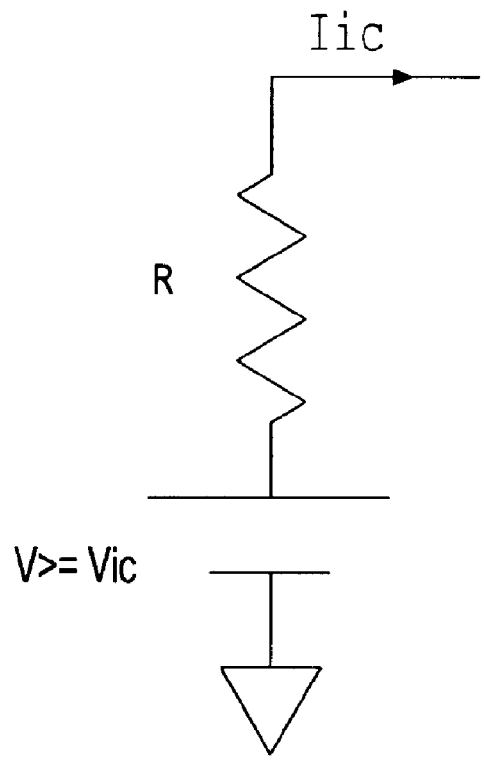

The first method for detecting 'bad' ICs consists of measuring the current needed to hold a node at the specified voltage (Vic). This current is labeled Iic in FIGS. 1A and 1B. A function f(Iic) of this current is computed to quantitatively determine how 'bad' the ICs are. An example of such a function is f(Iic)=(abs(Iic)−Ithresh), where Ithresh is a positive threshold current. Thus, if the magnitude of the current exceeds predetermined threshold, and as a result, f(Iic) is positive, the IC is labeled as 'bad'.

Determining the current threshold can be accomplished in a number of ways, two of which will be mentioned. The first is to simply use a fixed value supplied either by the simulator or obtained from the user. This provides a degree of control to the simulator or user but can also be burdensome to them. Another approach consists of setting a ratio of the current Iic to the loop current (Ir). This ratio can be determined by the simulator or obtained from the user. The selection of the ratio depends on the value of G, which in turn depends on the value of GN, determined by methods A1 or A2.

Method B2

Background for B2

The second method for detecting 'bad' ICs consists of two steps, the first of which is a variation of a conventional method while the second is novel.

The first step is to run an additional simulation after the first DC with a reduced set of ICs. The simulation is first run with all the ICs applied and the voltages recorded. In the commonly used approach, all the ICs are removed and another simulation is performed, using the first solution as the starting point, again recording the resulting voltages. While this approach usually allows the simulator to find a solution despite potentially inconsistent ICs, it does not guarantee that the solution found is correct. Moreover, it does not insure that "fragile" ICs (unstable voltage states easily altered during simulation) are maintained during the DC simulation. This prior art inventive method resimulates with no ICs present, starting from the potentially inconsistent DC state provided by the first DC simulation. This may not yield the same results as running a DC simulation starting from a set of consistent ICs, which the present inventive method (below) aims to achieve, which is novel and which will be described hereinafter.

When modifying the conventional two DC-simulation approaches, some of the ICs are left in place to ensure that they are enforced. This is particularly important for ICs which may be "fragile" and easily lost during the DC simulation. This second simulation allows the circuit to relax into a self-consistent state. The inventive method differs from the standard method by selectively retaining some of the ICs.

Having thus obtained two sets of node voltages, one from each DC simulation, the simulator then proceeds through all the nodes and examines how much they drifted between the first and second DC simulations. The novel aspects of this method consist of flagging an IC as inconsistent by examining the results of a function (g) of the voltage difference: g(Vdc1−Vdc2) at each node upon which an IC is applied. By way of example, a function may be $$g(Vdc1-Vdc2)=abs(Vdc1-Vdc2)-Vthresh,$$

where Vthresh is a positive voltage-difference threshold. The threshold can be preset by the simulator or input by the user. This simple but important method for classifying 'bad' ICs can be performed very robustly and with the need for few heuristics, as voltage ranges are typically well understood and well bounded.

The two methods (B1 and B2) are independent of each other, either one or both can be applied to the same circuit with the same collection of ICs.

C. Remedial Action Upon Detecting a 'Bad' IC

Having used the above methods to detect one or more inconsistent IC's in a circuit simulation specification, it becomes necessary to choose a course of action. Such action may consist only of notifying the user of the detection, but it may also involve the removal of the 'bad' ICs.

The inventive method described hereinafter consists of removing one or more bad ICs followed by resimulation, using the last simulation (during which the bad ICs were found) as a starting point. This process of detection and removal of 'bad' ICs is repeated until no new ones are detected or until some other predetermined stopping criterion (such as a number of tries) is reached. The selection of 'bad' ICs can be preferably done in the following manner:

a) Select a random 'bad' IC on the basis that it is difficult to pick 'the best one'.
b) Order the 'bad' ICs by how badly they failed (i.e., largest f(Iic) or largest g(Vdc1−Vdc2) and remove one or more of the worst offenders. One may select the worst ones from either or both of the worst-current or worst-voltage drift lists.

Other criteria for removal may be advantageously employed, such as topological or circuit-related classification of ICs, such as ICs on dynamic nodes, feedback nodes, output nodes, and nodes with weak or strong connection to ground or Vdd, and the like.

The removal step is preferably followed by another simulation or simulation-and-test or simulation-test-and-remove. Alternatively, one may simply proceed to the next phase of the simulation (e.g., transient or frequency analysis) without redoing the DC analysis, but notifying the users and allowing them to decide how to handle the inconsistencies.

D. Storage of ICs for Future Use

Having thus obtained a consistent set of ICs through the methods outlined above, it is advantageous to preserve it in association with the particular circuit, set of inputs and user specified ICs from which it was derived. A database is therefore created to store the circuit, the inputs to the circuit, including user specified ICs, and associating therewith the final set of consistent ICs actually used.

If the same circuit/input combination is subsequently encountered, one need only look up the set of ICs to use, rather than going through the laborious and expensive process of deriving again a set of consistent ICs.

Figure 2:
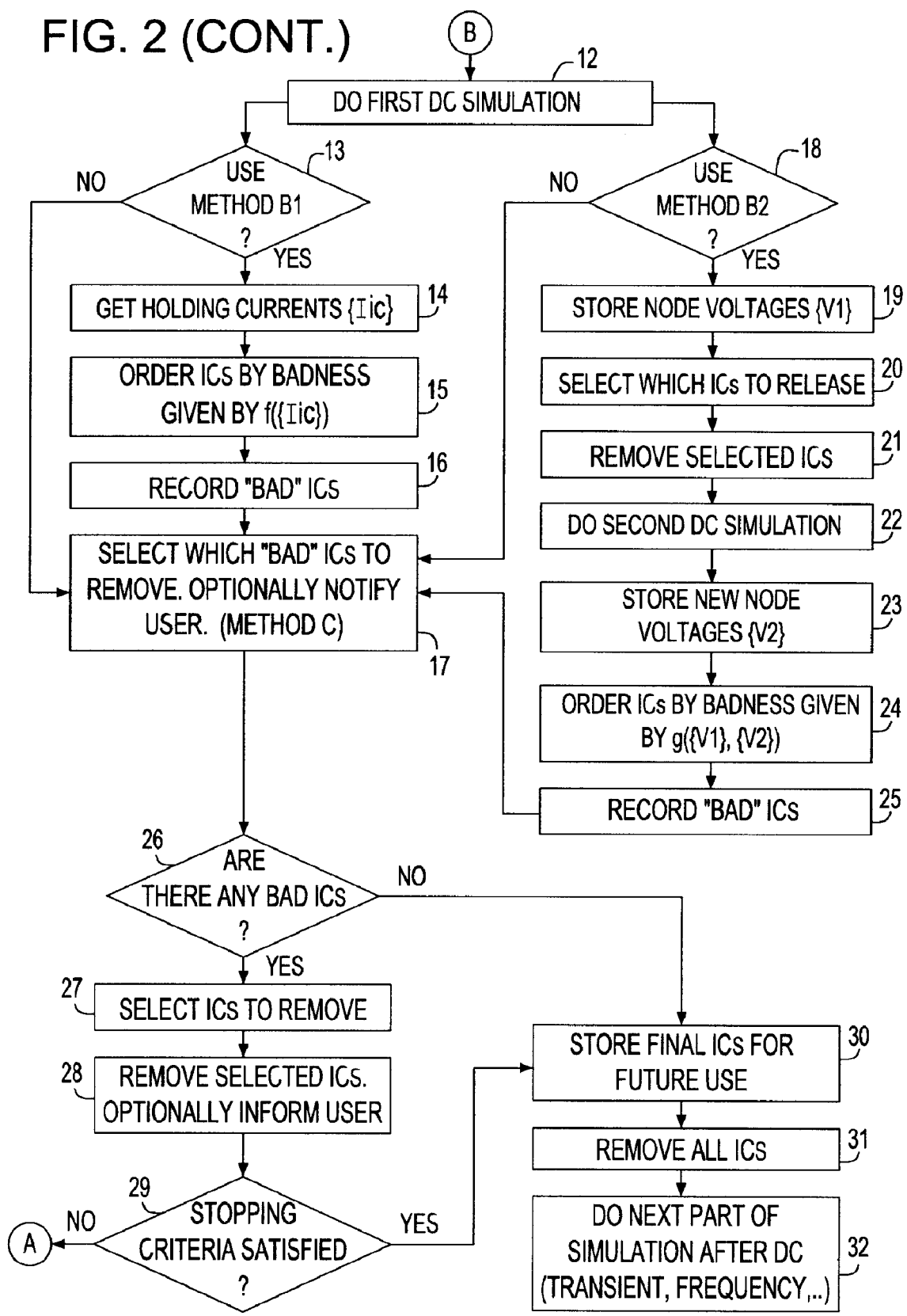
FIG. 2 is a flowchart illustrating the method and system according to the present invention, for testing the validity of initial-condition statements in a circuit simulation and correcting IC inconsistencies.

Referring now to FIG. 2, there is shown a detailed flowchart that illustrates a preferred embodiment of the steps required to implement the invention. For clarity, each of the steps will be expanded upon hereinafter. It is understood that this flow represents only part of the circuit simulation process associated with setting the ICs. Practitioners of the art will readily recognize that circuit simulation also involves many other steps including reading in the user-supplied circuit netlist, evaluating element values, stamping the matrix, and the like.

Step 1: Read the IC list preferably supplied by the user. The user must tell the simulator what nodes to initialize, and to which value. In the present method, the user may also specify which of the ICs are non-negotiable, and must unconditionally be applied.

Step 2: Does a stored set of self-consistent ICs associated with this circuit, its DC inputs, and the original user-specified list exist? If no, go to step 3; else, go to step 4.

Step 3: No suitable pre-stored consistent set of ICs exists. Then, the starting IC set is the one provided by the user in step 1.

Step 4: A suitable set of consistent ICs for the circuit, inputs and original user supplied IC-list already exists. Then, the starting list of ICs becomes the stored one.

Step 5: Read an IC from the current set obtained either from step 3 or step 4.

Steps 6-8: The simulator selects whether to use the Norton or Thevenin equivalent circuit (see FIGS. 1A, 1B) to apply the ICs. If the Thevenin approach is selected, a choice of whether to have R=0 or non-zero must be made. In the case of an R=0 Thevenin circuit, branch to step 10. Steps 6-8 determine the type of modifications which will need to be made to the mathematical representation of the circuit in step 10.

Step 9: In order to select the equivalent circuit parameters V and G, such that (V−Vn) and (1+GN/G) remain accurately measurable, one estimates or measures GN by way of methods A1 or A2, and then set G>>GN (e.g. 100×). Set V=Vic (the target voltage) or, if tighter matching of Vn and Vic is needed, set V=Vic (1+GN/G).

Step 10: Using the values V, G, modify the mathematical representation of the circuit in a way equivalent to adding one of the effective circuits of FIGS. 1A-1B for each IC.

Step 11: If there are more ICs, return to step 4 and repeat; else, branch to step 12.

Step 12: Perform a first DC simulation with all ICs present. At this point, two parallel and independent courses of action may be taken: either steps 14-16, or steps 19-25, or both.

Step 13: Should method B1 be used to determine inconsistent ICs? If yes, proceed to step 14; otherwise, go to step 17.

Step 14: Measure the DC holding current needed to maintain each IC, recording these currents as {Iic}.

Step 15: Apply function 'f' to each holding current. The simplest example of 'f' consists of comparing the absolute value of each holding current to a threshold. The function "f" must return a quantitative metric of how 'bad' the IC is. One such metric could be the value by which the absolute value of the holding current exceeds the threshold.

Step 16: Record the 'bad' ICs based on the value returned by 'f'.

Step 17: Select the 'bad' ICs from step 16 and 25 to be removed. Exclude from consideration ICs which the user has deemed non-negotiable or "fragile". If method B2 is used, steps 18-25 will need to be done before proceeding beyond this point. In either case, once steps 13-16 and 18-25 are completed, if applicable, proceed to step 26.

Step 18: Is method B2 selected to determine IC inconsistencies? If so, proceed to step 19; else, go to step 17.

Step 19: Store the node voltages {V1} resulting from step 12.

Step 20: Select ICs that are not non-negotiable or 'fragile'.

Step 21: Remove the ICs identified by step 20 by modifying or rebuilding the mathematical representation of the circuit in such a way as to effectively remove the equivalent circuits of FIGS. 1A-1B.

Step 22: Perform a second DC simulation with a reduced set of ICs determined by steps 20-21.

Step 23: Record the node voltages resulting from this second DC simulation as {V2}.

Step 24: Apply function 'g' to the two sets of voltages {V1} and {V2} in order to produce a quantitative metric of the ICs' 'badness'. The simplest example of 'g' is the absolute value of the node-voltage change compared to a threshold.

Step 25: Record the 'bad' ICs identified by step 24. Go to step 17.

Step 26: Determine if there are any additional 'bad' ICs, as determined by steps 16 and 25. If yes, proceed to step 27; if no, branch to step 29.

Step 27: Select which 'bad' ICs to remove as identified by steps 24-25.

Step 28: Remove the ICs selected by step 17 from the list of ICs to be applied. Optionally, one may inform the user of the detected inconsistency and the removal of the ICs.

Step 29: Has a stop criterion been satisfied? If yes, go to step 30; otherwise, branch to step 11, and repeat the process until the criterion is satisfied. Examples of stopping criteria may be the lack of any inconsistent ICs or having reached an iteration counter limit.

Step 30: Store the consistent set of ICs and associate it with: this circuit, its DC input values and the original user-supplied IC list.

Step 31: Remove all ICs, including the non-negotiable or "fragile" ones.

Step 32: The process of applying the ICs and the DC phase of simulation is complete. Proceed to the next phase of simulation (e.g.: transient analysis, frequency analysis, and the like).

While the present invention has been particularly described in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method of validating initial conditions (ICs) of a circuit when simulating the circuit and correcting inconsistencies thereof, comprising the steps of:
   a) selecting a set of user-provided ICs and applying said set of user-provided ICs to respective nodes of said circuit;
   b) detecting inconsistencies in said user-provided IC set;
   c) eliminating said inconsistent ICs from said user-provided IC set and replacing an original set of said user-provided ICs by a subset thereof comprising valid ICs; and
   d) repeating steps b) and c) until a predetermined ending criterion is met, said inconsistencies being detected by:
      i) measuring currents flowing in or out a selected node to which an IC is applied;
      ii) determining whether said measured current flowing in or out a selected node exceeds a predetermined threshold;
      iii) ordering the ICs applied as a function of each measured current flowing in or out said selected node and said predetermined threshold; and
      iv) determining which of said user-provided ICs to remove from the user-provided set of ICs.

2. The method as recited in claim 1, wherein step a) further comprises adding to said selected nodes a Norton or Thevenin equivalent circuit to apply said ICs.

3. The method as recited in claim 2, wherein values of a Norton or Thevenin equivalent circuit voltage V and conductance G are obtained by:
   a) computing an input impedance of a node at which said IC is applied;

b) setting an equivalent circuit impedance to be smaller than the node input impedance; and c) assigning the value of V by solving equation V=Vic(1+GN/G), wherein Vic is a target voltage, and GN is an effective input conductance of a node N.

4. The method as recited in claim 3, wherein G is set such that G>>GN, in the range of 10 to 100 times larger.

5. The method as recited in claim 3 wherein if an equivalent circuit selected is a Norton circuit, of which a value of a current source thereof is computed by solving equation $$I=Vic(G+GN)=V*G,$$

wherein Vic is the target voltage, V is the Voltage defined in claim 3, GN is the effective input conductance of the node N, and G is an equivalent Norton conductance.

6. The method as recited in claim 1, wherein step a) further comprises determining whether a set of said user-provided ICs is user-specified or a set of stored ICs.

7. The method as recited in claim 1, wherein in step b) said inconsistencies are detected by performing a first DC simulation to achieve a steady state set of currents and voltages in said circuit.

8. The method as recited in claim 1, wherein said inconsistencies are detected by:

a) measuring node voltages resulting from performing said first DC simulation;

b) selecting which of said nodes are to have said equivalent circuit removed thereof;

c) performing a second DC simulation and measuring the node voltages resulting from said second DC simulation;

d) ordering the user-provided set of ICs as a function of the node voltages resulting from said first and second DC simulation; and e) determining which ones of said ordered user-provided set ICs are to be removed.

9. The method as recited in claim 8, further comprising the step of constructing a new list of ICs comprising the user-provided set of ICs, from which the user-provided set of ICs with inconsistencies have been removed.

10. The method as recited in claim 9, further comprising the step of storing a final set of ICs from said new list of ICs associating a set of user-provided ICs and a specification of the circuit.

11. The method as recited in claim 1, further comprising the step of informing the user which of said ICs were removed.

12. A program storage device readable by a machine, tangibly, embodying a program of instructions executable by the machine to perform method steps for validating initial conditions (ICs) of a circuit when simulating the circuit and correcting inconsistencies thereof, said method steps comprising:

a) selecting a set of user-provided ICs and applying said set of user-provided ICs to respective nodes of said circuit;

b) detecting inconsistencies in said user-provided IC;

c) eliminating said inconsistent ICs from said user-provided IC set and replacing an original one of said user-provided IC sets by a subset thereof comprising valid ICs; and d) repeating steps b) and c) until a predetermined ending criterion is met, said inconsistencies being detected by:

i) measuring currents flowing in or out a selected node to which an IC is applied;

ii) determining whether said measured current flowing in or out a selected node exceeds a predetermined threshold;

iii) ordering the ICs applied as a function of each measured current flowing in or out said selected node and said predetermined threshold; and iv) determining which of said user-provided ICs to remove from the user-provided set of ICs.

* * * * *